United States Patent
Deng et al.

(10) Patent No.: US 9,655,047 B2
(45) Date of Patent: May 16, 2017

(54) REDUCING POWER CONSUMPTION OF A WIRELESS TERMINAL

(71) Applicant: Huawei Device Co., Ltd., Shenzhen (CN)

(72) Inventors: Yu Deng, Shanghai (CN); Konggang Wei, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 306 days.

(21) Appl. No.: 14/142,519

(22) Filed: Dec. 27, 2013

(65) Prior Publication Data

US 2014/0113641 A1 Apr. 24, 2014

Related U.S. Application Data

(63) Continuation of application No. PCT/CN2012/080324, filed on Aug. 17, 2012.

(51) Int. Cl.
*H04W 52/02* (2009.01)
*H03G 3/20* (2006.01)
*H04W 52/26* (2009.01)

(52) U.S. Cl.
CPC .......... *H04W 52/0229* (2013.01); *H03G 3/20* (2013.01); *H04W 52/0216* (2013.01);
(Continued)

(58) Field of Classification Search
CPC ......... H04W 52/0229; H04W 52/0251; H04W 52/267; H04W 52/0216; H03G 3/20; Y02B 60/50
See application file for complete search history.

(56) References Cited

U.S. PATENT DOCUMENTS

2002/0094835 A1 7/2002 Hayashi et al.
2004/0203983 A1 10/2004 Klomsdorf et al.
(Continued)

FOREIGN PATENT DOCUMENTS

CN 1457204 A 11/2003
CN 1679255 A 10/2005
(Continued)

OTHER PUBLICATIONS

"3rd Generation Partnership Project; Technical Specification Group Radio Access Network; User Equipment (UE) procedures in idle mode and procedures for cell reselection in connected mode; (Release 10)," 3GPP TS 25.304, V10.1.0, pp. 1-52, 3rd Generation Partnership Project, Valbonne, France (Jun. 2011).

(Continued)

*Primary Examiner* — Marcos Torres
(74) *Attorney, Agent, or Firm* — Leydig, Voit & Mayer, Ltd.

(57) ABSTRACT

A wireless terminal is provided, including a main control unit, a radio frequency power amplifier, and an antenna, where: the main control unit is coupled to the radio frequency power amplifier, and an output end of the radio frequency power amplifier is coupled to the antenna; the main control unit is configured to initiate a procedure for establishing a physical channel, and send a first gain control instruction to the radio frequency power amplifier, where when there is no uplink data to be transmitted through the physical channel link within a first preset time, the first gain control instruction is an instruction for reducing a gain; the radio frequency power amplifier determines its gain level according to the first gain control instruction; and the antenna is configured to transmit a radio frequency signal amplified by the radio frequency power amplifier.

14 Claims, 6 Drawing Sheets

(52) U.S. Cl.
CPC ..... *H04W 52/0251* (2013.01); *H04W 52/267* (2013.01); *Y02B 60/50* (2013.01)

(56) References Cited

U.S. PATENT DOCUMENTS

| | | | |
|---|---|---|---|
| 2004/0219959 A1* | 11/2004 | Khayrallah | H04B 7/0871 455/575.7 |
| 2006/0088008 A1* | 4/2006 | Kim | H04W 52/0229 370/336 |
| 2012/0100897 A1 | 4/2012 | Chen | |

FOREIGN PATENT DOCUMENTS

| | | |
|---|---|---|
| CN | 101243617 A | 8/2008 |
| CN | 101399578 A | 4/2009 |
| CN | 101442812 A | 5/2009 |
| CN | 101605388 A | 12/2009 |
| EP | 1617575 A1 | 1/2006 |
| EP | 1916859 A1 | 4/2008 |
| JP | 2002217829 A | 8/2002 |
| JP | 2005252388 A | 9/2005 |
| JP | 2005534232 A | 11/2005 |
| WO | WO 2004010604 A1 | 1/2004 |
| WO | WO 2007013457 A1 | 2/2007 |

OTHER PUBLICATIONS

1st Office Action and Search Report in cognate Chinese Patent Application No. 2012800335165 (Aug. 29, 2016).
Office Action and Search Report in corresponding Chinese Patent Application No. 201280033516.5 (Feb. 15, 2017).

* cited by examiner

REDUCING POWER CONSUMPTION OF A WIRELESS TERMINAL

CROSS REFERENCE AND RELATED APPLICATIONS

This application is a continuation of International Patent Application No. PCT/CN2012/080324, filed on Aug. 17, 2012, which is hereby incorporated in this application by reference in its entirety.

TECHNICAL FIELD

The present invention relates to the field of communication technologies, and in particular, to a wireless terminal and a method for reducing power consumption of the wireless terminal.

BACKGROUND

With the increasing popularity of smart phones and upgrade of computing capabilities, mobile phones are no longer simple wireless terminals, and more and more mobile phones serve as palmtops and play an increasingly important role in people's life and work. However, as mobile phones provide more functions, the power consumption of smart phones increases. Under the circumstance that no important breakthrough is achieved in the battery technology, how to reduce the power consumption of mobile phones and prolong the standby time of mobile phones becomes a pressing issue to be addressed.

In the prior art, after a wireless terminal establishes a communication link with a wireless network, that is, the wireless terminal enters a dedicated channel (Dedicated Channel, DCH) state, in this state, the terminal will request different radio access bearer (Radio Access Bearer, RAB) links from the mobile network according to different service types. When a requested service type is a packet switched (Packet Switch, PS) domain network service, little data is exchanged actually. For example, in the opening of a Web page, the exchange of data is actually completed within two or three seconds, but the DCH needs to be maintained for about 30 seconds. In this idle state, if the wireless terminal immediately exits the DCH, when the user clicks to access other Web pages within 30 seconds, the wireless terminal needs to reestablish a DCH connection and request a RAB bearer link, which inevitably causes problems such as a long delay in refreshing Web pages and extra power consumption in establishing the link and affects the user experience. If no proper solution is used to control the power consumption, the extra power consumption in this idle period affects the service time of the terminal.

At present, to reduce the power consumption of the uplink power amplifier of the wireless terminal device in the DCH state, a fast dormancy (fast dormancy) technology is proposed in a 3GPP standard, that is, after the user sends data, the DCH is released within a short time (5-10 seconds), so that the wireless terminal returns to the standby state or CELL_PICH channel state and further closes the uplink to reduce power consumption. The specific procedure is illustrated in FIG. 1.

Main disadvantages of the fast dormancy technology are as follows:

1. This technology not only requires the terminal to have the fast dormancy function, but also requires the network side to support the CELL_PICH connection feature. However, this technology is not popular yet, and 3 G networks of many operators do not support the feature.

2. After fast dormancy is adopted, as indicated by signaling 26 to 30 in the figure, the mobile phone still needs to interact with the network side to send and receive signaling and disconnect the link. However, sending and receiving signaling mean extra power consumption of the power amplifier for the terminal, and mean that the network side needs to process more signaling. This undoubtedly increases the load of the network device.

As shown by signaling 29 and signaling 30 in FIG. 1, if the DCH link is torn down, the terminal needs to request to establish a link again when the user reinitiates a data service. Such signaling delays the sending of user data and affects the user experience, while causing more power consumption and a heavier load on the network side.

SUMMARY

Embodiments of the present invention provide a wireless terminal and a method to reduce power consumption of the terminal.

According to a first aspect of the present invention, a wireless terminal includes a main control unit, a radio frequency power amplifier, and an antenna, where:

the main control unit is coupled to the radio frequency power amplifier, and an output end of the radio frequency power amplifier is coupled to the antenna;

the main control unit is configured to initiate a procedure for establishing a physical channel, and send a first gain control instruction to the radio frequency power amplifier, where when there is no uplink data to be transmitted through the physical channel link within a first preset time, the first gain control instruction is an instruction for reducing a gain;

the radio frequency power amplifier determines its gain level according to the first gain control instruction; and the antenna is configured to transmit a radio frequency signal amplified by the radio frequency power amplifier.

In a first possible implementation of the first aspect, the wireless terminal further includes a radio frequency transceiver, where: an input end of the radio frequency transceiver is coupled to the main control unit, and an output end of the radio frequency transceiver is coupled to an input end of the radio frequency power amplifier;

the main control unit is further configured to encode uplink data to be transmitted through the physical channel link; and the radio frequency transceiver is configured to receive the uplink data from the main control unit, and modulate the uplink data into the radio frequency signal.

In combination with the first aspect or the first possible implementation of the first aspect, in a second possible implementation, the wireless terminal further includes an automatic gain control (AGC) circuit respectively coupled to the main control unit and the radio frequency power amplifier, where the main control unit is further configured to send a second gain control instruction to the AGC circuit, where when there is no uplink data to be transmitted through the physical channel link within the first preset time, the second gain control instruction is an instruction for reducing the gain.

In combination with the first aspect or the first possible implementation of the first aspect or the second possible implementation of the first aspect, in a third possible implementation, when there is uplink data to be transmitted, the first gain control instruction and/or the second gain control instruction is an instruction for increasing the gain.

In combination with the first aspect or the first possible implementation of the first aspect or the second possible implementation of the first aspect or the third possible implementation of the first aspect, in a fourth possible implementation, when the terminal establishes a radio access bearer for bearing a circuit switched domain service, the first gain control instruction and/or the second gain control instruction is an instruction for increasing the gain.

In combination with the first aspect or the first possible implementation of the first aspect or the second possible implementation of the first aspect or the third possible implementation of the first aspect or the fourth possible implementation of the first aspect, in a fifth possible implementation, the wireless terminal further includes a first memory, where: the first memory is coupled to the main control unit; the main control unit is further configured to detect whether at least one radio frame exists in the memory coupled to the main control unit in the wireless terminal; and when no radio frame exists in the first memory, the main control unit considers that there is no uplink data to be transmitted through the physical channel link.

In combination with the fifth possible implementation of the first aspect, in a sixth possible implementation, when a radio frame exists in the first memory, the main control unit considers that there is uplink data to be transmitted through the physical channel link.

In combination with the first aspect or the first possible implementation of the first aspect or the second possible implementation of the first aspect or the third possible implementation of the first aspect or the fourth possible implementation of the first aspect, in a seventh possible implementation, the main control unit is further configured to detect whether there is data to be transmitted in an encoder of the main control unit; and when there is data to be transmitted in the encoder of the main control unit, the main control unit considers that there is uplink data to be transmitted through the physical channel link.

In combination with the seventh possible implementation of the first aspect, in an eighth possible implementation, when there is no data to be transmitted in the encoder of the main control unit, the main control unit considers that there is no uplink data to be transmitted through the physical channel link.

In combination with the first aspect or the first possible implementation of the first aspect or the second possible implementation of the first aspect or the third possible implementation of the first aspect or the fourth possible implementation of the first aspect, in a ninth possible implementation, the wireless terminal further includes a second memory, where: the second memory is coupled to the main control unit; the main control unit of the wireless terminal is further configured to detect whether data exists in the second memory; and when no data exists in the second memory, the main control unit considers that there is no uplink data to be transmitted through the physical channel link.

In combination with the ninth possible implementation of the first aspect, in a tenth possible implementation, when data exists in the second memory, the main control unit considers that there is uplink data to be transmitted through the physical channel link.

In combination with the first aspect or any one of the first possible implementation to the tenth possible implementation of the first aspect, in an eleventh possible implementation, the physical channel is specifically a dedicated channel DCH.

In combination with the first aspect or any one of the first possible implementation to the eleventh possible implementation of the first aspect, in a twelfth possible implementation, the first preset time is specifically 1 second.

In combination with the first aspect or any one of the first possible implementation to the twelfth possible implementation of the first aspect, in a thirteenth possible implementation, the gain control instruction is specifically an instruction for reducing the gain level of the radio frequency power amplifier to −50 dB.

According to a second aspect of the present invention, a method for reducing power consumption of a wireless terminal includes:

establishing, by the wireless terminal, a physical channel link; and when there is no uplink data to be transmitted through the physical channel link within a first preset time, reducing an uplink gain of the physical channel link.

In a first possible implementation of the second aspect, when there is uplink data to be transmitted, increasing the uplink gain of the physical channel link.

In combination with the second aspect or the first possible implementation of the second aspect, in a second possible implementation, the method further includes: when the wireless terminal establishes a radio access bearer for bearing a circuit switched domain service, increasing the uplink gain of the physical channel link.

In combination with the second aspect or the first possible implementation of the second aspect or the second possible implementation of the second aspect, in a third possible implementation, before reducing the uplink gain of the physical channel link when there is no uplink data to be transmitted through the physical channel link within the first preset time, the method further includes:

setting the first preset time according to a user's instruction for setting the preset time.

In combination with the second aspect or the first possible implementation of the second aspect or the second possible implementation of the second aspect or the third possible implementation of the second aspect, in a fourth possible implementation, after reducing the uplink gain of the physical channel link when there is no uplink data to be transmitted through the physical channel link within the first preset time, the method further includes:

when there is no uplink data to be transmitted through the physical channel link within a second preset time, reducing the uplink gain of the physical channel link again.

In combination with the second aspect or the fourth possible implementation of the second aspect, in a fifth possible implementation, before reducing the uplink gain of the physical channel link when there is no uplink data to be transmitted through the physical channel link within the first preset time, the method further includes:

setting the second preset time according to the user's instruction for setting the preset time.

In combination with the second aspect or any one of the first possible implementation to the fifth possible implementation of the second aspect, in a sixth possible implementation, the first preset time is specifically 1 second.

In combination with the second aspect or any one of the first possible implementation to the sixth possible implementation of the second aspect, in a seventh possible implementation, the reducing the uplink gain of the physical channel link specifically includes: reducing the uplink gain of the physical channel link so that transmit power of the mobile terminal is reduced to −50 dBm.

In combination with the second aspect or any one of the first possible implementation to the seventh possible implementation of the second aspect, in an eighth possible implementation, before reducing the uplink gain of the physical channel link, the method further includes:

detecting whether at least one radio frame exists in a first memory connected to a baseband processor of the wireless terminal in the wireless terminal;

the reducing the uplink gain of the physical channel link when there is no uplink data to be transmitted through the transmission channel link within the first preset time specifically includes:

if there is no radio frame in the first memory within the first preset time, reducing the uplink gain of the physical channel link.

In combination with the second aspect or any one of the first possible implementation to the seventh possible implementation of the second aspect, in a ninth possible implementation, before reducing the uplink gain of the physical channel link, the method further includes:

detecting whether there is data to be transmitted at layer 1 of a baseband processor of the wireless terminal;

the reducing the uplink gain of the physical channel link when there is no uplink data to be transmitted through the transmission channel link within the first preset time specifically includes:

if there is no data to be transmitted at layer 1 of the baseband processor of the wireless terminal within the first preset time, reducing the uplink gain of the physical channel link.

In combination with the second aspect or the ninth possible implementation of the second aspect, in a tenth possible implementation, the detecting whether there is data to be transmitted at layer 1 of a baseband chip of the wireless terminal specifically includes:

detecting whether there is data to be transmitted in an encoder of the baseband processor;

the reducing the uplink gain of the physical channel link if there is no data to be transmitted at layer 1 of the baseband processor of the wireless terminal within the first preset time specifically includes:

if there is data to be transmitted in the encoder of the baseband processor within the first preset time, reducing the uplink gain of the physical channel link.

In combination with the second aspect or any one of the first possible implementation to the seventh possible implementation of the second aspect, in an eleventh possible implementation, before reducing the uplink gain of the physical channel link, the method further includes:

storing, by layer 3 of a baseband processor of the wireless terminal, the uplink data to a second memory of the wireless terminal; and detecting, by a main control unit of the wireless terminal, whether data exists in the second memory;

the reducing the uplink gain of the physical channel link when there is no uplink data to be transmitted through the transmission channel link within the first preset time specifically includes:

if no data exists in the second memory within the first preset time, reducing the uplink gain of the physical channel link.

In combination with the second aspect or any one of the first possible implementation to the twelfth possible implementation of the second aspect, in a thirteenth possible implementation, the physical channel is a dedicated channel.

According to a third aspect of the present invention, a wireless terminal includes:

a physical channel link establishing unit, configured to establish a physical channel link; and a gain control unit, configured to reduce an uplink gain of the physical channel link when there is no uplink data to be transmitted through the physical channel link within a first preset time.

In a first possible implementation of the third aspect, the gain control unit is further configured to increase the uplink gain of the physical channel link when there is uplink data to be transmitted.

In combination with the third aspect or the first possible implementation of the third aspect, in a second possible implementation, the gain control unit is further configured to increase the uplink gain of the physical channel link when the terminal establishes a radio access bearer for bearing a circuit switched CS domain service.

In combination with the third aspect or the first possible implementation of the third aspect or the second possible implementation of the third aspect, in a third possible implementation, the gain control unit is further configured to increase the uplink gain of the physical channel link when the terminal establishes a radio access bearer for bearing a circuit switched domain service.

In combination with the third aspect or the first possible implementation of the third aspect or the second possible implementation of the third aspect or the third possible implementation of the third aspect, in a fourth possible implementation, the gain control unit is further configured to reduce the uplink gain of the physical channel link again when there is no uplink data to be transmitted through the physical channel link within a second preset time.

In combination with the third aspect or any one of the first possible implementation to the fourth possible implementation of the third aspect, in a fifth possible implementation, the terminal further includes a preset time setting unit, configured to set at least one of the first preset time and the second preset time according to a user's instruction for setting the preset time.

In combination with the third aspect or any one of the first possible implementation to the fifth possible implementation of the third aspect, in a sixth possible implementation, the terminal further includes an enabling unit, configured to enable the gain control unit.

In combination with the third aspect or any one of the first possible implementation to the sixth possible implementation of the third aspect, in a seventh possible implementation, the physical channel is a dedicated channel.

In combination with the third aspect or any one of the first possible implementation to the seventh possible implementation of the third aspect, in an eighth possible implementation, the first preset time is specifically 1 second.

In combination with the third aspect or any one of the first possible implementation to the eighth possible implementation of the third aspect, in a ninth possible implementation, the uplink gain of the physical channel link is reduced so that transmit power of the mobile terminal is reduced to −50 dBm.

According to a fourth aspect of the present invention, a wireless terminal includes a main control unit, a radio frequency power amplifier, and an antenna, where:

the main control unit is coupled to the radio frequency power amplifier, and an output end of the radio frequency power amplifier is coupled to the antenna;

the main control unit is configured to initiate a procedure for establishing a physical channel, and send a first gain control instruction to the radio frequency power amplifier, where when an amount of uplink data to be transmitted through the physical channel link within a first preset time is smaller than a first threshold, the first gain control instruction is an instruction for reducing a gain;

the radio frequency power amplifier determines its gain level according to the first gain control instruction; and the antenna is configured to transmit a radio frequency signal amplified by the radio frequency power amplifier.

In a first possible implementation of the fourth aspect, the wireless terminal further includes a radio frequency transceiver, where: an input end of the radio frequency transceiver is coupled to the main control unit, and an output end of the radio frequency transceiver is coupled to an input end of the radio frequency power amplifier;

the main control unit is further configured to encode uplink data to be transmitted through the physical channel link; and the radio frequency transceiver is configured to receive the uplink data from the main control unit, and modulate the uplink data into the radio frequency signal.

In combination with the fourth aspect or the first possible implementation of the fourth aspect, in a second possible implementation, the terminal further includes an automatic gain control (AGC) circuit coupled to the main control unit and the radio frequency power amplifier, where the main control unit is further configured to send a second gain control instruction to the AGC circuit, where when the amount of uplink data to be transmitted through the physical channel link within the first preset time is smaller than the first threshold, the second gain control instruction is an instruction for reducing the gain.

In combination with the fourth aspect or the first possible implementation of the fourth aspect or the second possible implementation of the fourth aspect, in a third possible implementation, when the terminal establishes a radio access bearer for bearing a domain service, the first gain control instruction and/or the second gain control instruction is an instruction for increasing the gain.

In combination with the fourth aspect or the first possible implementation of the fourth aspect or the second possible implementation of the fourth aspect or the third possible implementation of the fourth aspect, in a fourth possible implementation, when an amount of uplink data to be transmitted through the physical channel link within a second preset time is greater than a second threshold, the first gain control instruction and/or the second gain control instruction is an instruction for increasing the gain.

In combination with the fourth aspect or any one of the first possible implementation to the fourth possible implementation of the fourth aspect, in an eighth possible implementation, the first preset time is 1 second.

In combination with the fourth aspect or any one of the first possible implementation to the fifth possible implementation of the fourth aspect, in a sixth possible implementation, the uplink gain of the physical channel link is reduced so that transmit power of the mobile terminal is reduced to −50 dBm.

According to a fifth aspect of the present invention, a method for reducing power consumption of a wireless terminal includes:

establishing, by the terminal, a physical channel link; and when an amount of uplink data to be transmitted through the physical channel link within a first preset time is smaller than a first threshold, reducing an uplink gain of the physical channel link.

In a first possible implementation of the fifth aspect, after reducing the uplink gain of the physical channel link when the amount of uplink data to be transmitted through the physical channel link within the first preset time is smaller than the first threshold, the method further includes:

when an amount of uplink data to be transmitted through the physical channel link within a second preset time is greater than a second threshold, increasing the uplink gain of the physical channel link.

In combination with the fifth aspect or the first possible implementation of the fifth aspect, in a second possible implementation, after reducing the uplink gain of the physical channel link when the amount of uplink data to be transmitted through the physical channel link within the first preset time is smaller than the first threshold, the method further includes:

when the terminal establishes a radio access bearer for bearing a domain service, increasing the uplink gain of the physical channel link.

In combination with the fifth aspect or the first possible implementation of the fifth aspect or the second possible implementation of the fifth aspect, in a third possible implementation, after reducing the uplink gain of the physical channel link when the amount of uplink data to be transmitted through the physical channel link within the first preset time is smaller than the first threshold, the method further includes:

when the terminal establishes a radio access bearer for bearing a domain service, increasing the uplink gain of the physical channel link.

In combination with the fifth aspect or any one of the first possible implementation to the third possible implementation of the fifth aspect, in a fourth possible implementation, the first preset time is specifically 1 second.

In combination with the fifth aspect or any one of the first possible implementation to the fourth possible implementation of the fifth aspect, in a fifth possible implementation, the uplink gain of the physical channel link is reduced so that transmit power of the mobile terminal is reduced to −50 dBm.

In combination with the fifth aspect or any one of the first possible implementation to the fifth possible implementation of the fifth aspect, in a sixth possible implementation, the physical channel is a dedicated channel.

According to a sixth aspect of the present invention, a wireless terminal includes:

a physical channel link establishing unit, configured to establish a physical channel link; and a gain control unit, configured to reduce an uplink gain of the physical channel link when an amount of uplink data to be transmitted through the physical channel link within a first preset time is smaller than a first threshold.

In a first possible implementation of the sixth aspect, the gain control unit is further configured to increase the uplink gain of the physical channel link when an amount of uplink data to be transmitted through the physical channel link within a second preset time is greater than a second threshold.

In combination with the sixth aspect or the first possible implementation of the sixth aspect, in a second possible implementation, the gain control unit is further configured to increase the uplink gain of the physical channel link when the terminal establishes a radio access bearer for bearing a domain service.

In combination with the sixth aspect or the first possible implementation of the sixth aspect or the second possible implementation of the sixth aspect, in a third possible implementation, the gain control unit is further configured to reduce the uplink gain of the physical channel link again when there is no uplink data to be transmitted through the physical channel link within a third preset time.

In combination with the sixth aspect or any one of the first possible implementation to the third possible implementation of the sixth aspect, in a fourth possible implementation, the wireless terminal further includes a preset time setting unit, configured to set at least one of the first preset time, the second preset time, and the third preset time according to a user's instruction for setting the preset time.

In combination with the sixth aspect or any one of the first possible implementation to the fourth possible implementation of the sixth aspect, in a fifth possible implementation, the wireless terminal further includes an enabling unit, configured to enable the gain control unit and/or disable the gain control unit.

In combination with the sixth aspect or any one of the first possible implementation to the fifth possible implementation of the sixth aspect, in a sixth possible implementation, the first preset time is 1 second.

In combination with the sixth aspect or any one of the first possible implementation to the sixth possible implementation of the sixth aspect, in a seventh possible implementation, the uplink gain of the physical channel link is reduced so that transmit power of the mobile terminal is reduced to −50 dBm.

In combination with the sixth aspect or any one of the first possible implementation to the seventh possible implementation of the sixth aspect, in an eighth possible implementation, the physical channel is specifically a dedicated channel.

By using the wireless terminal and method provided according to various implementations of the present invention, when there is no uplink data to be transmitted through the physical channel link within a period, an uplink gain of the physical channel link is reduced, so that power consumption of the wireless terminal is effectively reduced.

BRIEF DESCRIPTION OF DRAWINGS

To illustrate the technical solutions in the embodiments of the present invention or in the prior art more clearly, the following briefly describes the accompanying drawings required for describing the embodiments or the prior art.

DESCRIPTION OF EMBODIMENTS

Specific embodiments of the present invention are described in detail with reference to the accompanying drawings in the following. First of all, the wording and terms used in the various embodiments are explained in the following:

"Wireless terminal" refers to a terminal device of a wireless communication network, and includes but is not limited to: a mobile phone, a personal digital assistant (Personal Digital Assistant, PDA), a tablet computer (Tablet PC), and a data card (Datacard).

"Dedicated channel" (DCH) refers to a radio communication link established between a mobile terminal device and a wireless network and used to bear a specific service of a user.

"Uplink" refers to a data transmission direction from a mobile terminal device to a wireless network.

"Downlink" refers to a data transmission direction from the wireless network to the mobile terminal device.

"Gain" refers to the extent of an increase of the current, voltage, or power for a component, a circuit, a device, or a system. "Gain" usually uses decibel (dB) as its unit.

"Radio access bearer" (RAB) refers to a user plane bearer, used for transmitting voice, data, and multimedia services between a terminal and a core network.

In the following embodiments, "coupling" between A and B means that a determined association is established between an electrical signal passing through A and an electrical signal passing through B. The association includes a direct connection between A and B through a conductor, or an indirect connection through another component C, and also includes an association established through electromagnetic induction between an electrical signal passing through A and an electrical signal passing through B, as established by a transformer.

The ordinal numbers such as "first" and "second" mentioned in the present invention serve the purpose of differentiation only unless the numbers definitely indicate sequence according to the context.

Figure 1:
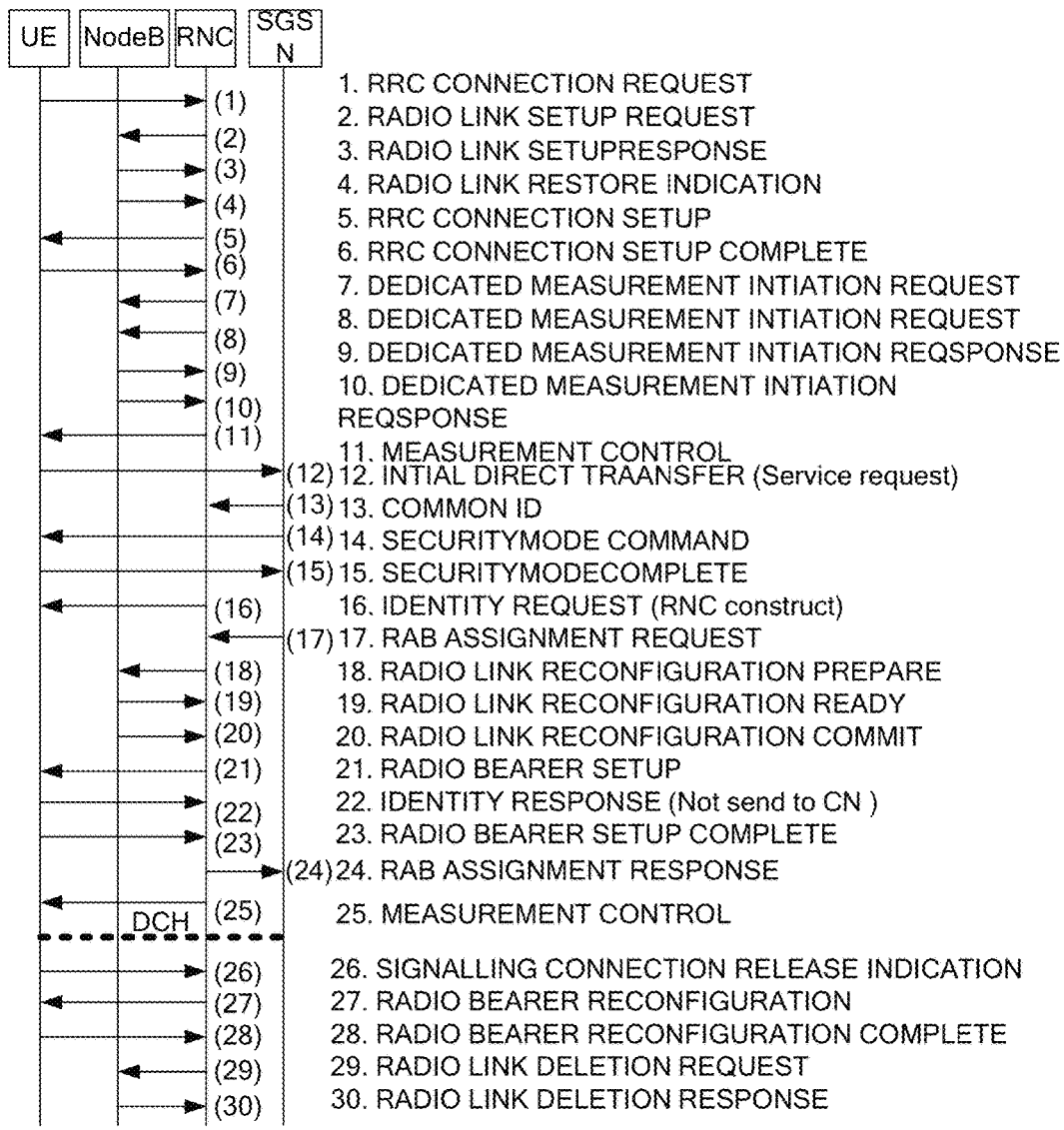
FIG. 1 is a signaling flowchart of fast dormancy in the prior art.
Figure 2:
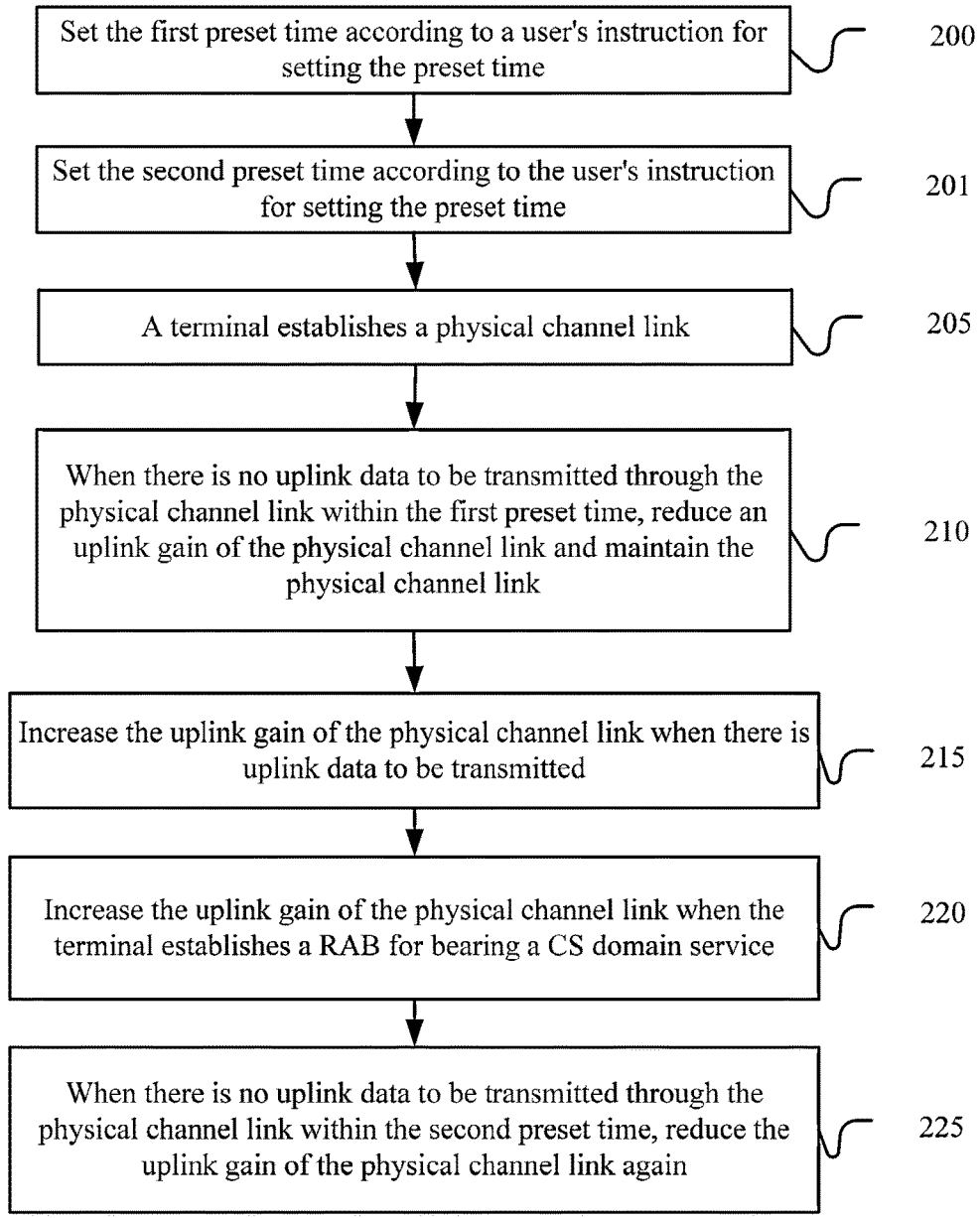
FIG. 2 is a flowchart of a method embodiment of the present invention.

As shown in FIG. 2, a method embodiment of the present invention includes the following steps:

205. A terminal establishes a physical channel link.

It should be understood that the establishing herein is a process in which the terminal participates in establishing a physical channel link, that is, the terminal sends signaling to the wireless network and receives signaling from the wireless network until a physical channel link is established between the terminal and the wireless network.

210. When there is no uplink data to be transmitted through the physical channel link within a first preset time, reduce an uplink gain of the physical channel link.

It should be understood that the physical channel link is maintained but is not disconnected when the step of reducing an uplink gain of the physical channel link is performed. Certainly, if there is no data to be transmitted through the physical channel link after a longer time, the link may be disconnected.

In the above embodiment, during the period when the terminal maintains the physical channel link, when there is no uplink data to be transmitted within a period, the uplink gain of the physical channel link is reduced, so that power consumption of the terminal can be effectively reduced without disconnecting the physical channel link.

As shown in FIG. 2, the above embodiment may further include the following step:

215. Increase the uplink gain of the physical channel link when there is uplink data to be transmitted.

Increasing the uplink gain of the physical channel link when there is uplink data to be transmitted may improve the user experience without degrading the radio performance while saving power consumption of the terminal.

The above embodiment may further include the following:

220. Increase the uplink gain of the physical channel link when the terminal establishes a RAB for bearing a CS domain service.

Increasing the uplink gain of the physical channel link when the terminal establishes a RAB for bearing a CS domain service, such as making a call, may improve the user experience without degrading the radio performance while saving power consumption of the terminal.

Before step 210, the above embodiment may further include the following:

200. Set the first preset time according to a user's instruction for setting the preset time.

Furthermore, a switch for enabling or disabling the power consumption saving method may be set in the terminal, where the switch may be a hardware switch or a software switch.

After step 210, the above embodiment may further include the following:

225. When there is no uplink data to be transmitted through the physical channel link within a second preset time, reduce the uplink gain of the physical channel link again.

The second preset time may be equal or unequal to the first preset time.

Reducing the uplink gain of the physical channel link again after the second preset time may further reduce power consumption.

Before step 210, the above embodiment may further include the following:

201. Set the second preset time according to the user's instruction for setting the preset time.

One of the following three detection methods may be used to detect whether the wireless terminal has uplink data to be transmitted:

Method 1: The main control unit of the wireless terminal detects whether at least one radio frame exists in a first memory connected to a baseband processor of the wireless terminal in the wireless terminal. If no radio frame exists in the first memory, the main control unit considers that there is no data to be transmitted. If at least one radio frame exists in the first memory, the main control unit considers that there is uplink data to be transmitted. The at least one radio frame is stored by the baseband processor into the first memory, and may be generated by the baseband processor itself, or may also be generated by an application processor of the wireless terminal and then transmitted to the baseband processor.

Method 2: Detect whether there is data to be transmitted at layer 1 of a baseband chip of the wireless terminal. Detecting whether there is uplink data to be transmitted at layer 1 of the baseband processor of the wireless terminal may specifically include detecting whether there is data to be transmitted in the encoder of the baseband processor. If there is data to be transmitted in the encoder of the baseband processor (for example, at least one piece of radio frame data exists), the main control unit considers that there is uplink data to be transmitted. If there is no data to be transmitted in the encoder of the baseband processor, the main control unit considers that there is no uplink data to be transmitted.

Method 3: The main control unit of the wireless terminal detects whether there is data to be transmitted at layer 3 of the baseband processor of the wireless terminal. Specifically, the main control unit of the wireless terminal may detect whether there is data to be transmitted at the Packet Data Convergence Protocol (Packet Data Convergence Protocol, PDCP) sublayer of the layer 3. If the wireless terminal has data to be transmitted, the method may further include the following: The layer 3 stores the data to be transmitted into a second memory of the wireless terminal. The method may further include the following: The layer 1 of the main control unit of the wireless terminal reads the data to be transmitted from the second memory. The second memory may be located in the main control unit, or may also be located in the wireless terminal and connected to the main control unit. The layer 1 may read the data to be transmitted from the first memory at an interval of a preset time. Preferably, the preset time may be 10 milliseconds.

The detecting whether the wireless terminal has data to be transmitted to the wireless network side further includes:

the main control unit of the wireless terminal detects whether data exists in the second memory;

if the result of detecting whether the wireless terminal has data to be transmitted to the wireless network side is that the wireless terminal does not have data to be transmitted, comprises: the data does not exists in the second memory; and if the result of detecting whether the wireless terminal has data to be transmitted to the wireless network side is that the wireless terminal has data to be transmitted, comprises: the data exists in the second memory, and the data is a part or all of the at least one wireless frame.

Here, protocol layering of an air interface of 3GPP is introduced simply. The protocol layering of the air interface of 3GPP includes a network application layer, that is, a top layer, namely, Layer 3 which is marked as L3, and the layer includes various messages and programs and performs control and management on services. A Layer 2 and a Layer 1 are sequentially located below the Layer 3 in the protocol layering of the air interface. The Layer 2 is a data link layer, marked as L2, and is an intermediate layer. The L2 includes various data transmission structures, performs control on data transmission, and ensures that a reliable dedicated data link is established between a mobile station and a base station. The Layer 1 is a physical layer, marked as L1, and is a bottom layer providing a wireless link required by transferring bit streams. The L1, L2, and L3 all belong to 3 independent 3GPP protocol layers in the wireless terminal.

The main control unit may be the baseband processor itself of the wireless terminal or may also be another processing unit. At present, many smart phones generally include at least two processing units: One processing unit is a baseband processor, configured to process the baseband part of a radio signal, for example, encode and decode data. Another processing unit is configured to process various application programs running on the wireless terminal, and is usually referred to as an application processor (Application Processor, AP). The two processors may be two independent components or may also be integrated into a same chip. Therefore, the main control unit may also be a chip integrating the baseband processor and the application processor.

Controlling the uplink gain of the physical channel link may be implemented by controlling the gain of a radio frequency power amplifier of the wireless terminal, or may be implemented by controlling the gain of an automatic gain control (Automatic Gain Controlling, AGC) circuit of the wireless terminal, or may be implemented by controlling the gain of the radio frequency power amplifier of the wireless terminal and the gain of the AGC circuit of the wireless terminal. Specifically, usually the radio frequency power amplifier has a PA Mode pin, where the pin is used to control the power amplification level of the radio frequency power amplifier. For example, a radio frequency power amplifier may have five amplification levels, and each level has a difference of 10 dB. The signal on the PA Mode pin controls at which level the radio frequency power amplifier works. In each level, the specific amplification rate may be controlled by the AGC circuit.

In an embodiment, the first preset time is 1 second. The time, after being tested by the inventor, can meet the requirement for reducing power consumption and maintaining radio performance of the mobile terminal in a balanced manner.

In an embodiment, the uplink gain of the physical channel link is reduced so that transmit power of the mobile terminal is reduced to −50 dBm. The value, after being tested by the inventor, can meet the requirement for reducing power consumption and maintaining radio performance of the mobile terminal in a balanced manner, so that the time of increasing the transmit power is not too long to affect radio performance when the wireless terminal wants to transmit uplink data subsequently.

Figure 3A:
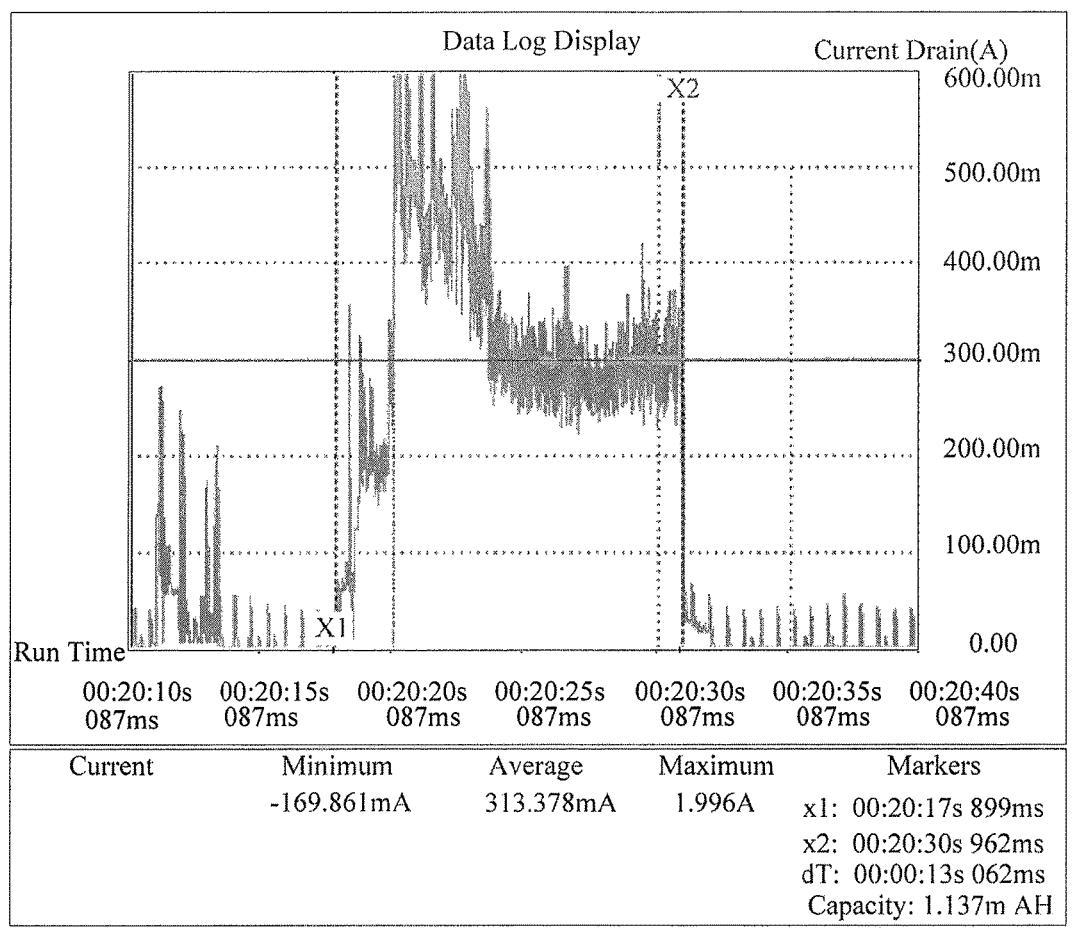
FIG. 3A shows a power consumption state not using a method of an embodiment of the present invention in an embodiment.
Figure 3B:
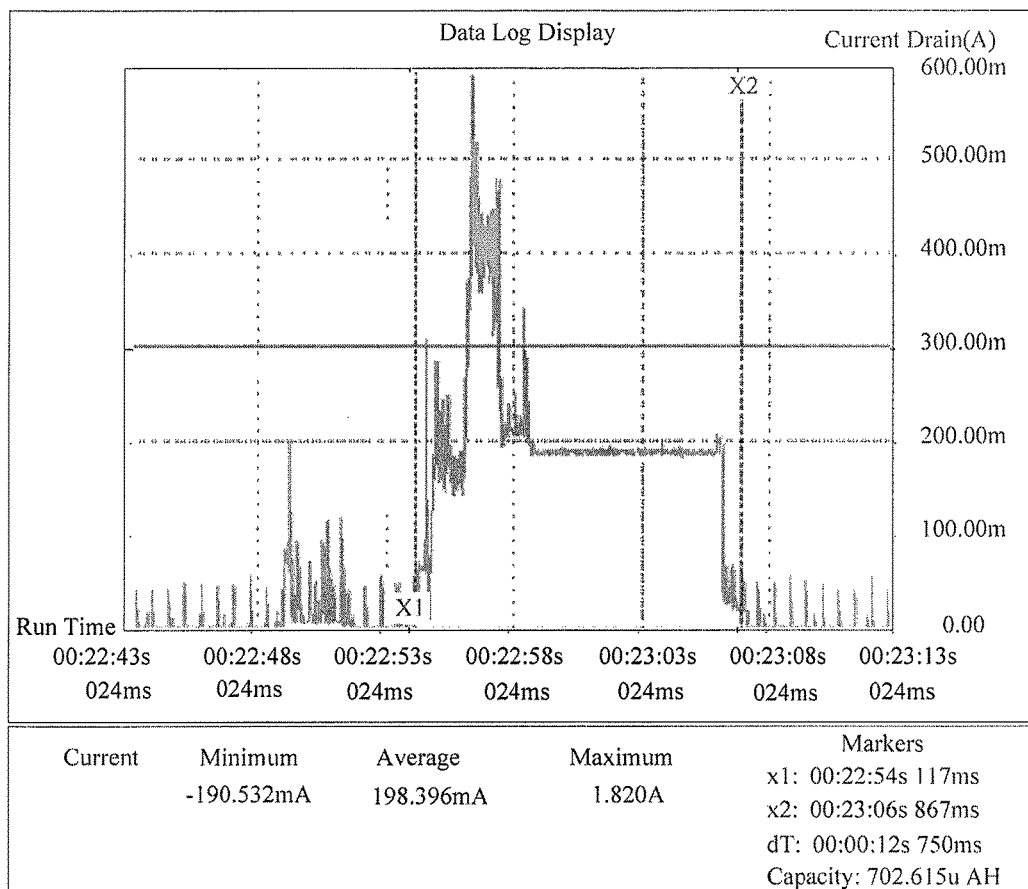
FIG. 3B shows a power consumption state using a method of an embodiment of the present invention in an embodiment.

FIG. 3A and FIG. 3B are diagrams showing the effect of using an embodiment of the present invention in an embodiment. Taking the opening of a Web page by a user as an example, FIG. 3A shows a power consumption state not using a method of an embodiment of the present invention; the uplink is always in the high gain state in the whole process from establishing to disconnecting the physical channel link and causes the average power consumption to reach 313.378 mA. FIG. 3B shows a state using a method of an embodiment of the present invention; except in the early data interaction, the power consumption is in the low gain state; the average power consumption is 198.396 mA, and power consumption is optimized by 114.982 mA (36.7%).

Figure 6:
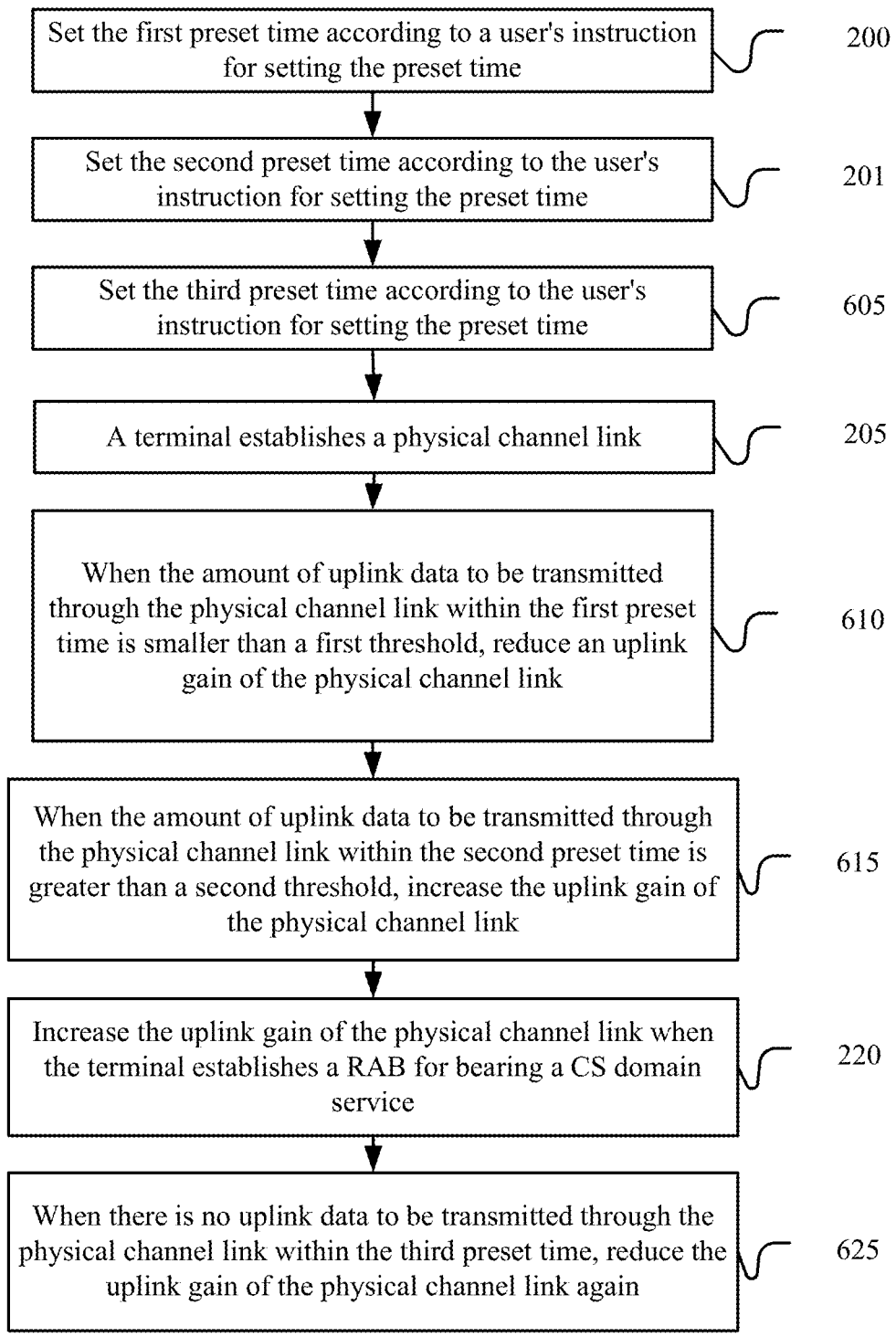
FIG. 6 is a flowchart of a method according to another embodiment of the present invention.

As shown in FIG. 6, as an alternative embodiment, a method embodiment of the present invention includes the following steps:

205. A terminal establishes a physical channel link.

It should be understood that the establishing herein is a process in which the terminal participates in establishing a physical channel link, that is, the terminal sends signaling to the wireless network and receives signaling from the wireless network until a physical channel link is established between the terminal and the wireless network.

610. When the amount of uplink data to be transmitted through the physical channel link within a first preset time is smaller than a first threshold, reduce an uplink gain of the physical channel link.

The amount of uplink data may be obtained by using many methods. For example, a lot of traffic monitoring software may be used to calculate the amount of uplink data.

It should be understood that the physical channel link is maintained but is not disconnected when the step of reducing an uplink gain of the physical channel link is performed. Certainly, if there is no data to be transmitted through the physical channel link after a longer time, the link may be disconnected.

In the above embodiment, in the period when the terminal maintains the physical channel link, reducing the uplink gain of the physical channel link when the amount of uplink data to be transmitted through the physical channel link within the first preset time is smaller than the first threshold may effectively reduce power consumption of the terminal without disconnecting the physical channel link.

As shown in FIG. 6, the above embodiment may further include the following step:

615. When the amount of uplink data to be transmitted through the physical channel link within a second preset time is greater than a second threshold, increase the uplink gain of the physical channel link.

Herein the second preset time may be equal or unequal to the first preset time. The second threshold may be equal to the first preset time or unequal to the first threshold.

Increasing the uplink gain of the physical channel link when the amount of uplink data to be transmitted through the physical channel link within the second preset time is greater than the second threshold may improve the user experience without degrading the radio performance while saving power consumption of the terminal.

The above method may further include the following:

220. Increase the uplink gain of the physical channel link when the terminal establishes a RAB for bearing a CS domain service.

Increasing the uplink gain of the physical channel link when the terminal establishes a RAB for bearing a CS domain service, such as making a call, may improve the user experience without degrading the radio performance while saving power consumption of the terminal.

Before step 210, the above embodiment may further include the following:

200. Set the first preset time according to a user's instruction for setting the preset time.

Furthermore, a switch for enabling or disabling the power consumption saving method may be set in the terminal, where the switch may be a hardware switch or a software switch.

After step 210, the above embodiment may further include the following:

625. When there is no uplink data to be transmitted through the physical channel link within a third preset time, reduce the uplink gain of the physical channel link again.

The third preset time may be equal or unequal to the first preset time.

Reducing the uplink gain of the physical channel link again after the third preset time may further reduce power consumption.

Before step 610, the above embodiment may further include the following:

201. Set the second preset time according to the user's instruction for setting the preset time.

Before step 610, the above embodiment may further include the following:

605. Set the third preset time according to the user's instruction for setting the preset time.

Controlling the uplink gain of the physical channel link may be implemented by controlling the gain of a radio frequency power amplifier of the wireless terminal, or may be implemented by controlling the gain of an automatic gain control (Automatic Gain Controlling, AGC) circuit of the wireless terminal, or may be implemented by controlling the gain of the radio frequency power amplifier of the wireless terminal and the gain of the AGC circuit of the wireless terminal. Specifically, usually the radio frequency power amplifier has a PA Mode pin, where the pin is used to control the power amplification level of the radio frequency power amplifier. For example, a radio frequency power amplifier may have five amplification levels, and each level has a difference of 10 dB. The signal on the PA Mode pin controls at which level the radio frequency power amplifier works. In each level, the specific amplification rate may be controlled by the AGC circuit.

In an embodiment, the first preset time is 1 second. The time, after being tested by the inventor, can meet the requirement for reducing power consumption and maintaining radio performance of the mobile terminal in a balanced manner.

In an embodiment, the uplink gain of the physical channel link is reduced so that transmit power of the mobile terminal is reduced to −50 dBm. The value, after being tested by the inventor, can meet the requirement for reducing power consumption and maintaining radio performance of the mobile terminal in a balanced manner, so that the time of increasing the transmit power is not too long to affect radio performance when the wireless terminal wants to transmit uplink data subsequently.

Figure 4:
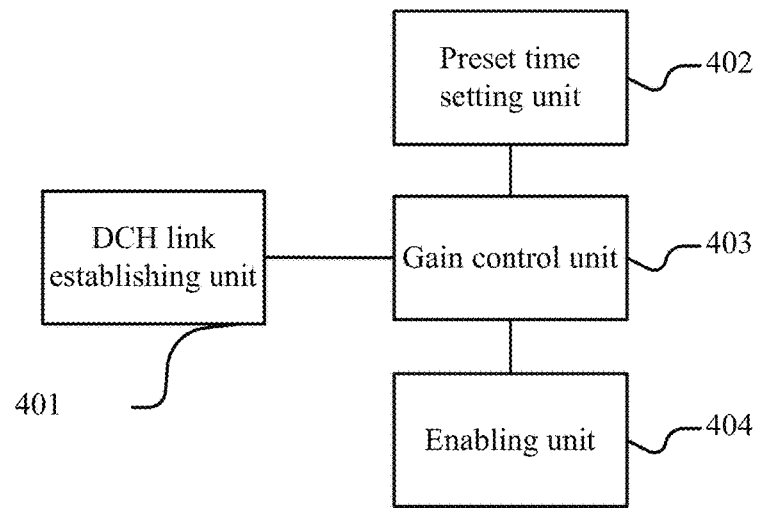
FIG. 4 is a schematic structural diagram of a wireless terminal according to an embodiment of the present invention.

As shown in FIG. 4, a wireless terminal provided in another embodiment of the present invention includes:

a physical channel link establishing unit 401, configured to establish a physical channel link; and a gain control unit 403, configured to reduce an uplink gain of the physical channel link when there is no uplink data to be transmitted through the physical channel link within a first preset time.

It should be understood that the physical channel link is maintained but is not disconnected when the gain control unit 403 reduces the uplink gain of the physical channel link. Certainly, if there is no data to be transmitted through physical channel link after a longer time, the link may be disconnected.

In an embodiment, the gain control unit 403 is further configured to increase the uplink gain of the physical channel link when there is data to be transmitted. Increasing the uplink gain of the physical channel link when there is uplink data to be transmitted may improve the user experience without degrading the radio performance while saving power consumption of the terminal.

In another embodiment, the gain control unit 403 is further configured to increase the uplink gain of the physical channel link when the terminal establishes a RAB for bearing a CS domain service. Increasing the uplink gain of the physical channel link when the terminal establishes a RAB for bearing a CS domain service, such as making a call, may improve the user experience without degrading the radio performance while saving power consumption of the terminal.

In still another embodiment, the gain control unit 403 is further configured to reduce the uplink gain of the physical channel link again when there is no uplink data to be transmitted through the physical channel link within a second preset time.

As shown in FIG. 4, the above wireless terminal may further include:

a preset time setting unit 402, configured to set the first preset time according to a user's instruction for setting the preset time. In an embodiment, the preset time setting unit 402 is further configured to set the second preset time according to the user's instruction for setting the preset time.

As shown in FIG. 4, the wireless terminal may further include:

an enabling unit 404, configured to enable the gain control unit 403.

The enabling unit 404 may be further configured to disable the gain control unit 403.

The enabling unit 404 may be a hardware switch or a software switch.

The following methods may be used to detect whether the physical channel link has data to be transmitted:

Method 1: The main control unit of the wireless terminal detects whether at least one radio frame exists in a first memory connected to a baseband processor of the wireless terminal in the wireless terminal. If no radio frame exists in the first memory, the main control unit considers that there is no data to be transmitted. If at least one radio frame exists in the first memory, the main control unit considers that there is data to be transmitted. The at least one radio frame is stored by the baseband processor into the first memory, and may be generated by the baseband processor itself, or may also be generated by an application processor of the wireless terminal and then transmitted to the baseband processor.

Method 2: Detect whether there is data to be transmitted at layer 1 of a baseband chip of the wireless terminal. Detecting whether there is data to be transmitted at layer 1 of the baseband processor of the wireless terminal may specifically include detecting whether there is data to be transmitted in the encoder of the baseband processor. If there is data to be transmitted in the encoder of the baseband processor (for example, at least one piece of radio frame data exists), the main control unit considers that there is data to be transmitted. If there is no data to be transmitted in the encoder of the baseband processor, the main control unit considers that there is no data to be transmitted.

Method 3: The main control unit of the wireless terminal detects whether there is data to be transmitted at layer 3 of the baseband chip of the wireless terminal. Specifically, the main control unit of the wireless terminal may detect whether there is data to be transmitted at the Packet Data Convergence Protocol (Packet Data Convergence Protocol, PDCP) sublayer of the layer 3. If the wireless terminal has data to be transmitted, the method may further include the following: The layer 3 stores the data to be transmitted into a second memory of the wireless terminal. The method may further include the following: The layer 1 of the main control unit of the wireless terminal reads the data to be transmitted from the second memory. The second memory may be located in the main control unit, or may also be located in the wireless terminal and connected to the main control unit. The layer 1 may read the data to be transmitted from the first memory at an interval of a preset time. Preferably, the preset time may be 10 milliseconds.

The detecting whether the wireless terminal has data to be transmitted to the wireless network side further includes:

the main control unit of the wireless terminal detects whether data exists in the second memory;

if the result of detecting whether the wireless terminal has data to be transmitted to the wireless network side is that the wireless terminal does not have data to be transmitted, the data does not exists in the second memory; and if the result of detecting whether the wireless terminal has data to be transmitted to the wireless network side is that the wireless terminal has data to be transmitted, the data exists in the second memory, and the data is a part or all of the at least one wireless frame.

Here, protocol layering of an air interface of 3GPP is introduced simply. The protocol layering of the air interface of 3GPP includes a network application layer, that is, a top layer, namely, Layer 3 which is marked as L3, and the layer includes various messages and programs and performs control and management on services. A Layer 2 and a Layer 1 are sequentially located below the Layer 3 in the protocol layering of the air interface. The Layer 2 is a data link layer, marked as L2, and is an intermediate layer. The L2 includes various data transmission structures, performs control on data transmission, and ensures that a reliable dedicated data link is established between a mobile station and a base station. The Layer 1 is a physical layer, marked as L1, and is a bottom layer providing a wireless link required by transferring bit streams. The L1, L2, and L3 all belong to 3 independent 3GPP protocol layers in the wireless terminal.

The main control unit may be the baseband processor itself of the wireless terminal or may also be another processing unit. At present, many smart phones generally include at least two processing units: One processing unit is a baseband processor, configured to process the baseband part of a radio signal, for example, encode and decode data. Another processing unit is configured to process various application programs running on the wireless terminal, and is usually referred to as an application processor (Application Processor, AP). The two processors may be two independent components or may also be integrated into a same chip. Therefore, the main control unit may also be a chip integrating the baseband processor and the application processor.

Controlling the uplink gain of the physical channel link may be implemented by controlling the gain of a radio frequency power amplifier of the wireless terminal, or may be implemented by controlling the gain of an automatic gain control (Automatic Gain Controlling, AGC) circuit of the wireless terminal, or may be implemented by controlling the gain of the radio frequency power amplifier of the wireless terminal and the gain of the AGC circuit of the wireless terminal. Specifically, usually the radio frequency power amplifier has a PA Mode pin, where the pin is used to control the power amplification level of the radio frequency power amplifier. For example, a radio frequency power amplifier may have five amplification levels, and each level has a difference of 10 dB. The signal on the PA Mode pin controls at which level the radio frequency power amplifier works. In each level, the specific amplification rate may be controlled by the AGC circuit.

In an embodiment, the first preset time is 1 second. The time, after being tested by the inventor, can meet the requirement for reducing power consumption and maintaining radio performance of the mobile terminal in a balanced manner.

In an embodiment, the uplink gain of the physical channel link is reduced so that transmit power of the mobile terminal is reduced to −50 dBm. The value, after being tested by the inventor, can meet the requirement for reducing power consumption and maintaining radio performance of the mobile terminal in a balanced manner, so that the time of increasing the transmit power is not too long to affect radio performance when the wireless terminal wants to transmit uplink data subsequently.

As shown in FIG. 4, in an alternative embodiment:

the physical channel link establishing unit 401 is configured to establish a physical channel link.

It should be understood that the establishing herein is a process in which the terminal participates in establishing a physical channel link, that is, the terminal sends signaling to the wireless network and receives signaling from the wireless network until a physical channel link is established between the terminal and the wireless network.

The gain control unit 403 is configured to reduce an uplink gain of the physical channel link when an amount of uplink data to be transmitted through the physical channel link within a first preset time is smaller than a first threshold.

The amount of uplink data may be obtained by using many methods. For example, a lot of traffic monitoring software may be used to calculate the amount of uplink data.

It should be understood that the physical channel link is maintained but is not disconnected when the gain control unit 403 reduces the uplink gain of the physical channel link. Certainly, if there is no data to be transmitted through the physical channel link after a longer time, the link may be disconnected.

The amount of uplink data may be obtained by using many methods. For example, a lot of traffic monitoring software may be used to calculate the amount of uplink data.

In the above embodiment, in the period when the terminal maintains the physical channel link, reducing the uplink gain of the physical channel link when the amount of uplink data to be transmitted through the physical channel link within the first preset time is smaller than the first threshold may effectively reduce power consumption of the terminal without disconnecting the physical channel link.

In an embodiment, the gain control unit 403 is further configured to increase the uplink gain of the physical channel link when the amount of uplink data to be transmitted through the physical channel link within a second preset time is greater than a second threshold. Herein the second preset time may be equal or unequal to the first preset time. The second threshold may be equal to the first preset time or unequal to the first threshold. Increasing the uplink gain of the physical channel link when there is uplink data to be transmitted may improve the user experience without degrading the radio performance while saving power consumption of the terminal.

In another embodiment, the gain control unit 403 is further configured to increase the uplink gain of the physical channel link when the terminal establishes a RAB for bearing a CS domain service. Increasing the uplink gain of the physical channel link when the terminal establishes a RAB for bearing a CS domain service, such as making a call, may improve the user experience without degrading the radio performance while saving power consumption of the terminal.

In still another embodiment, the gain control unit 403 is further configured to reduce the uplink gain of the physical channel link again when there is no uplink data to be transmitted through the physical channel link within a third preset time.

As shown in FIG. 4, the above wireless terminal may further include:

a preset time setting unit 402, configured to set the first preset time according to a user's instruction for setting the preset time. In an embodiment, the preset time setting unit 402 is further configured to set the second preset time according to the user's instruction for setting the preset time. In another embodiment, the preset time setting unit 402 is further configured to set the third preset time according to the user's instruction for setting the preset time.

As shown in FIG. 4, the wireless terminal may further include:

an enabling unit 404, configured to enable the gain control unit 403.

The enabling unit 404 may be further configured to disable the gain control unit 403.

The enabling unit 404 may be a hardware switch or a software switch.

In an embodiment, the first preset time is 1 second. The time, after being tested by the inventor, can meet the requirement for reducing power consumption and maintaining radio performance of the mobile terminal in a balanced manner.

In an embodiment, the uplink gain of the physical channel link is reduced so that transmit power of the mobile terminal is reduced to −50 dBm. The value, after being tested by the inventor, can meet the requirement for reducing power consumption and maintaining radio performance of the mobile terminal in a balanced manner, so that the time of increasing the transmit power is not too long to affect radio performance when the wireless terminal wants to transmit uplink data subsequently.

Figure 5:
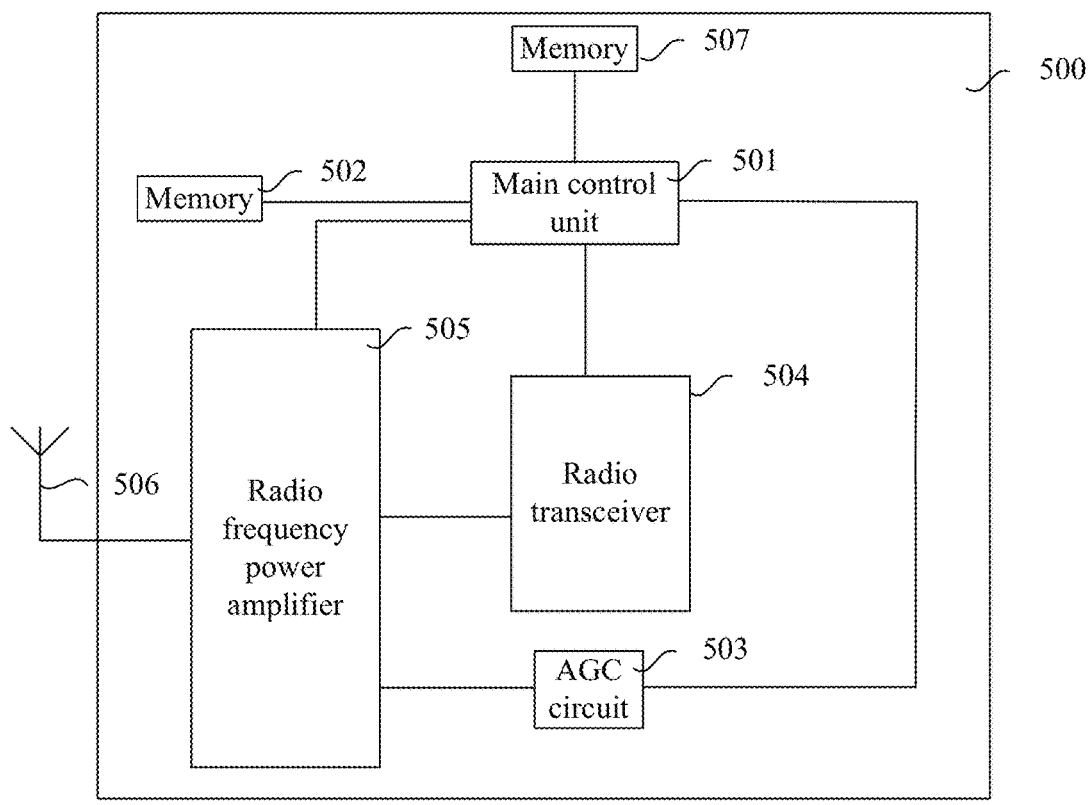
FIG. 5 is a schematic structural diagram of a wireless terminal according to another embodiment of the present invention.

Another embodiment of the present invention provides a wireless terminal. As shown in FIG. 5, the terminal includes a main control unit 501, a radio frequency power amplifier 505, and an antenna 506, where:

the main control unit 501 is coupled to the radio frequency power amplifier 505, and an output end of the radio frequency power amplifier 505 is coupled to the antenna 506;

the main control unit 501 is configured to initiate a procedure for establishing a physical channel, and send a first gain control instruction to the radio frequency power amplifier 505, where when there is no uplink data to be transmitted through the physical channel link within a first preset time, the first gain control instruction is an instruction for reducing a gain;

the radio frequency power amplifier 505 determines its gain level according to the first gain control instruction; and the antenna 506 is configured to transmit a radio frequency signal amplified by the radio frequency power amplifier.

As known by those skilled in the art, the gain level of the power amplifier is an important parameter of the power amplifier, and this parameter decides the extent of power amplification performed by the power amplifier for the signal to be input, and also decides the level of static power consumption of the power amplifier. If the gain level is high, the static power consumption is also high; if the gain level is low, the static power consumption is also low. Herein the static power consumption refers to power consumption generated when the power amplifier has no input signal. When there is no uplink data to be transmitted through the physical channel link, there may be no signal to be input at the input end of the radio frequency power amplifier 505, or there may be a wideband radio frequency signal not representing data to be input. When there is no signal to be input, the radio frequency power amplifier 505 has only static power consumption; when there is a wideband radio frequency signal to be input, the radio frequency power amplifier 505 amplifies the wideband radio frequency signal. In whichever case, the power consumption can be reduced only when the gain level of the radio frequency power amplifier 505 is reduced.

It should be understood that the physical channel link is maintained but is not disconnected when the uplink gain of the physical channel link is reduced. Certainly, if there is no data to be transmitted through the physical channel link after a longer time, the link may be disconnected.

In an embodiment, the wireless terminal 500 further includes a radio frequency transceiver 504, where: an input end of the radio frequency transceiver 504 is coupled to the main control unit 501, and an output end of the radio frequency transceiver 504 is coupled to an input end of the radio frequency power amplifier 505. The main control unit 501 is further configured to encode uplink data to be transmitted through the physical channel link.

The radio frequency transceiver 504 is configured to receive the uplink data from the main control unit 501, and modulate the uplink data into the radio frequency signal.

As shown in FIG. 5, the foregoing terminal may further include an automatic gain control (AGC) circuit 503 coupled to the main control unit 501 and the radio frequency power amplifier, where the main control unit 501 is further configured to send a second gain control instruction to the AGC circuit 503, where when no uplink data to be transmitted through the physical channel link is generated within the first preset time, the second gain control instruction is an instruction for reducing the gain.

Controlling the uplink gain of the physical channel link may be implemented by controlling the gain of a radio frequency power amplifier of the wireless terminal, or may be implemented by controlling the gain of an automatic gain control (Automatic Gain Controlling, AGC) circuit of the wireless terminal, or may be implemented by controlling the gain of the radio frequency power amplifier of the wireless terminal and the gain of the AGC circuit of the wireless terminal. Specifically, usually the radio frequency power amplifier has a PA Mode pin, where the pin is used to control the power amplification level of the radio frequency power amplifier. For example, a radio frequency power amplifier may have five amplification levels, and each level has a difference of 10 dB. The signal on the PA Mode pin controls at which level the radio frequency power amplifier works. In each level, the specific amplification rate may be controlled by the AGC circuit.

As shown in FIG. 5, the foregoing terminal may further include a memory 502, where the memory 502 is coupled to the main control unit 501. In an embodiment, the main control 501 detects whether at least one radio frame exists in the memory 502 coupled to the main control unit in the wireless terminal. If no radio frame exists in the memory 502, the main control unit considers that there is no data to be transmitted. If at least one radio frame exists in the memory 502, the main control unit considers that there is data to be transmitted. The at least one radio frame is stored by the main control unit 501 into the first memory.

In another embodiment, the main control unit 501 detects whether there is data to be transmitted at layer 1 of the main control unit 501 of the wireless terminal. Detecting whether there is data to be transmitted at layer 1 of the main control unit 501 of the wireless terminal may specifically include detecting whether there is data to be transmitted in the encoder of the main control unit. If there is data to be transmitted in the encoder of the main control unit (for example, at least one piece of radio frame data exists), the main control unit considers that there is data to be transmitted. If there is no data to be transmitted in the encoder of the main control unit 501, the main control unit 501 considers that there is no data to be transmitted.

In still another embodiment, the main control unit 501 of the wireless terminal detects whether there is data to be transmitted at layer 3 of the main control unit 501 of the wireless terminal. Specifically, the main control unit of the wireless terminal may detect whether there is data to be transmitted at the Packet Data Convergence Protocol (Packet Data Convergence Protocol, PDCP) sublayer of the layer 3. If the wireless terminal has data to be transmitted, the layer 3 may store the data to be transmitted into a memory 507 in the wireless terminal. The layer 1 of the main control unit 501 reads the data to be transmitted from the memory 507. The memory 507 may be located in the main control unit, or may also be located in the wireless terminal and connected to the main control unit. In addition, the layer 3 may store the data to be transmitted to the memory 502. The layer 1 may read the data to be transmitted from the first memory at an interval of a second preset time. Preferably, the second preset time may be 10 milliseconds.

The detecting whether the wireless terminal has data to be transmitted to the wireless network side further includes:

the main control unit of the wireless terminal detects whether data exists in the memory 507 (or memory 502);

the if the result of detecting whether the wireless terminal has data to be transmitted to the wireless network side is that the wireless terminal has no data to be transmitted, includes: the data does not exist in the memory 507 (or memory 502); and the if the result of detecting whether the wireless terminal has data to be transmitted to the wireless network side is that the wireless terminal has data to be transmitted, includes: the data is a part or all of the at least one radio frame.

Here, protocol layering of an air interface of 3GPP is introduced simply. The protocol layering of the air interface of 3GPP includes a network application layer, that is, a top layer, namely, Layer 3 which is marked as L3, and the layer includes various messages and programs and performs control and management on services. A Layer 2 and a Layer 1 are sequentially located below the Layer 3 in the protocol layering of the air interface. The Layer 2 is a data link layer, marked as L2, and is an intermediate layer. The L2 includes various data transmission structures, performs control on data transmission, and ensures that a reliable dedicated data link is established between a mobile station and a base station. The Layer 1 is a physical layer, marked as L1, and is a bottom layer providing a wireless link required by transferring bit streams. The L1, L2, and L3 all belong to 3 independent 3GPP protocol layers in the wireless terminal.

The main control unit 501 may be the baseband processor itself of the wireless terminal or may also be another processing unit. At present, many smart phones generally include at least two processing units: One processing unit is a baseband processor, configured to process the baseband part of a radio signal, for example, encode and decode data. Another processing unit is configured to process various application programs running on the wireless terminal, and is usually referred to as an application processor (Application Processor, AP). The two processors may be two independent components or may also be integrated into a same chip. Therefore, the main control unit may also be a chip integrating the baseband processor and the application processor.

In an embodiment, when there is uplink data to be transmitted, the first gain control instruction and/or the second gain control instruction is an instruction for increasing a gain.

Increasing the uplink gain of the physical channel link when there is uplink data to be transmitted may improve the user experience without degrading the radio performance while saving power consumption of the terminal.

In another embodiment, when the terminal establishes a RAB for bearing a CS domain service, the first gain control instruction and/or the second gain control instruction is an instruction for increasing the gain.

Increasing the uplink gain of the physical channel link when the terminal establishes a RAB for bearing a CS domain service, such as making a call, may improve the user experience without degrading the radio performance while saving power consumption of the terminal.

As shown in FIG. 5, as an alternative embodiment, a wireless terminal 500 provided by an embodiment of the present invention includes: a main control unit 501, a radio frequency power amplifier 505, and an antenna 506, where:

the main control unit 501 is coupled to the radio frequency power amplifier 505, and an output end of the radio frequency power amplifier 505 is coupled to the antenna 506;

the main control unit 501 is configured to initiate a procedure for establishing a physical channel, and send a first gain control instruction to the radio frequency power amplifier 505, where when an amount of uplink data to be transmitted through the physical channel link within a first preset time is smaller than a first threshold, the first gain control instruction is an instruction for reducing a gain;

the radio frequency power amplifier 505 determines its gain level according to the first gain control instruction; and the antenna 506 is configured to transmit a radio frequency signal amplified by the radio frequency power amplifier.

The amount of uplink data may be obtained by using many methods. For example, a lot of traffic monitoring software may be used to calculate the amount of uplink data.

As known by those skilled in the art, the gain level of the power amplifier is an important parameter of the power amplifier, and this parameter decides the extent of power amplification performed by the power amplifier for the signal to be input, and also decides the level of static power consumption of the power amplifier. If the gain level is high, the static power consumption is also high; if the gain level is low, the static power consumption is also low. Herein the static power consumption refers to power consumption generated when the power amplifier has no input signal. When there is no uplink data to be transmitted through the physical channel link, there may be no signal to be input at the input end of the radio frequency power amplifier 505, or there may be a wideband radio frequency signal not representing data to be input. When there is no signal to be input, the radio frequency power amplifier 505 has only static power consumption; when there is a wideband radio frequency signal to be input, the radio frequency power amplifier 505 amplifies the wideband radio frequency signal. In whichever case, the power consumption can be reduced only when the gain level of the radio frequency power amplifier 505 is reduced.

It should be understood that the physical channel link is maintained but is not disconnected when the uplink gain of the physical channel link is reduced. Certainly, if there is no data to be transmitted through the physical channel link after a longer time, the link may be disconnected.

The wireless terminal 500 may further include a radio frequency transceiver 504, where: an input end of the radio frequency transceiver 504 is coupled to the main control unit 501, and an output end of the radio frequency transceiver 504 is coupled to an input end of the radio frequency power amplifier 505.

The main control unit 501 is further configured to encode uplink data to be transmitted through the physical channel link.

The radio frequency transceiver 504 is configured to receive the uplink data from the main control unit 501, and modulate the uplink data into the radio frequency signal.

As shown in FIG. 5, the foregoing terminal may further include an automatic gain control (AGC) circuit 503 coupled to the main control unit 501 and the radio frequency power amplifier 505, where the main control unit 501 is further configured to send a second gain control instruction to the AGC circuit 503, where when the amount of uplink data to be transmitted through the physical channel link within a first preset time is smaller than a first threshold, the second gain control instruction is an instruction for reducing a gain.

In another embodiment, when the terminal establishes a RAB for bearing a CS domain service, the first gain control instruction and/or the second gain control instruction is an instruction for increasing the gain.

Increasing the uplink gain of the physical channel link when the terminal establishes a RAB for bearing a CS domain service, such as making a call, may improve the user experience without degrading the radio performance while saving power consumption of the terminal.

In an embodiment, when the amount of uplink data to be transmitted through the physical channel link within a second preset time is greater than a second threshold, the first gain control instruction and/or the second gain control instruction is an instruction for increasing the gain.

In an embodiment, the first preset time is 1 second. The time, after being tested by the inventor, can meet the requirement for reducing power consumption and maintaining radio performance of the mobile terminal in a balanced manner.

In an embodiment, the uplink gain of the physical channel link is reduced so that transmit power of the mobile terminal is reduced to −50 dBm. The value, after being tested by the inventor, can meet the requirement for reducing power consumption and maintaining radio performance of the mobile terminal in a balanced manner, so that the time of increasing the transmit power is not too long to affect radio performance when the wireless terminal wants to transmit uplink data subsequently.

The physical channel in the above embodiments may be specifically a dedicated channel (DCH) but is not limited to the DCH.

In addition, the technologies, systems, apparatus, methods in the foregoing embodiments and technical features respectively described in the embodiments can be combined, so as to form other modules, methods, apparatus, systems and technologies without departing from the spirit and principle of the present invention. The combined modules, methods, apparatus, systems, and technologies according to the record of the present invention should all fall within the protection scope of the present invention.

Apparently, persons skilled in the art should understand that, the foregoing units or steps of the present invention can be implemented by a general-purpose computational apparatus, and can be gathered on a single computational apparatus or be distributed on a network consisting of multiple computational apparatus. Optionally, the units or steps can be implemented through program codes executable by the computational apparatus, so that the program codes can be stored in a storage device to be executed by the computational apparatus. or be implemented by making the units and steps into various circuit modules, or making multiple units or steps thereof into a single circuit module. In the way, the present invention is not limited to any specific combination of hardware and software.

The foregoing descriptions are merely exemplary embodiments of the present invention, but not intended to limit the protection scope of the present invention. Any modification, equivalent replacement, and improvement made within the spirit and principle of the present invention should all fall within the protection scope of the present invention.

What is claimed is:

1. A wireless terminal comprising:
a control unit including an encoder;
a radio frequency power amplifier coupled to the control unit; and
an antenna coupled to an output of the radio frequency power amplifier,
wherein the control unit is configured to initiate a procedure for establishing a physical channel link between the wireless terminal and a server, wherein the control unit is further configured to detect whether there is data to be transmitted in the encoder and to determine that there is no uplink data to be transmitted through the physical channel link when there is no data to be transmitted in the encoder,
wherein the control unit is further configured to send a first gain control instruction to the radio frequency power amplifier when there is no uplink data to be transmitted through the physical channel link within a first preset time, wherein the first gain control instruction is used for reducing a gain of the radio frequency power amplifier while the radio frequency power amplifier is powered on,
wherein the radio frequency power amplifier is configured to adjust a gain level of the radio frequency power amplifier according to the gain control instruction, and
wherein the antenna is configured to transmit a radio frequency signal amplified by the radio frequency power amplifier based on the adjusted gain level.

2. The wireless terminal according to claim 1, further comprising a radio frequency transceiver, wherein an input of the radio frequency transceiver is coupled to the control unit, and an output of the radio frequency transceiver is coupled to an input of the radio frequency power amplifier,
wherein the control unit is further configured to encode uplink data to be transmitted through the physical channel link, and
wherein the radio frequency transceiver is configured to receive an uplink data from the control unit and modulate the uplink data into the radio frequency signal.

3. The wireless terminal according to claim 1, further comprising an automatic gain control (AGC) circuit coupled to the control unit and the radio frequency power amplifier,
wherein the control unit is further configured to send a second gain control instruction to the AGC circuit when there is no uplink data to be transmitted through the physical channel link within the first preset time, and
wherein the second gain control instruction is used for reducing a gain of the AGC circuit while the AGC circuit is powered on.

4. The wireless terminal according to claim 1, wherein the control unit is further configured to send an increasing gain control instruction to increase a gain of the radio frequency power amplifier to the radio frequency power amplifier when there is uplink data to be transmitted.

5. The wireless terminal according to claim 3, wherein the control unit is further configured to send an increasing gain control instruction to increase a gain of the AGC circuit to the AGC circuit when there is uplink data to be transmitted.

6. The wireless terminal according to claim 1, wherein the control unit is further configured to send an increasing gain control instruction to increase a gain of the radio frequency power amplifier to the radio frequency power amplifier when the terminal establishes a radio access bearer (RAB) for bearing a circuit switched (CS) domain service.

7. The wireless terminal according to claim 3, wherein the control unit is further configured to send an increasing gain control instruction to increase a gain of the AGC circuit to the AGC circuit when the terminal establishes a radio access bearer (RAB) for bearing a circuit switched (CS) domain service.

8. The wireless terminal according to claim 1, wherein the control unit is further configured to determine that there is uplink data to be transmitted through the physical channel link when there is data to be transmitted in the encoder.

9. A method for reducing power consumption of a wireless terminal, the method comprising:
establishing, by the wireless terminal, a physical channel link between the wireless terminal and a server;

detecting whether there is data to be transmitted at layer 1 of a baseband processor of the wireless terminal;

detecting whether there is data to be transmitted in an encoder of the baseband processor; and reducing a gain of a radio frequency power amplifier of the wireless terminal to reduce an uplink gain of the physical channel link under all of the following conditions:
- (a) when there is no uplink data to be transmitted through the physical channel link within a first preset time, wherein the radio frequency power amplifier is powered on when the gain of the radio frequency power amplifier is reduced;
- (b) when there is no data to be transmitted at the layer 1 of the baseband processor of the wireless terminal within the first preset time; and
- (c) when there is no data to be transmitted in the encoder of the baseband processor within the first preset time.

10. The method according to claim 9, further comprising:
increasing the gain of the radio frequency power amplifier to increase the uplink gain of the physical channel link when there is uplink data to be transmitted.

11. The method according to claim 9, further comprising:
increasing the gain of the radio frequency power amplifier to increase the uplink gain of the physical channel link when the wireless terminal establishes a radio access bearer (RAB) for bearing a circuit switched (CS) domain service.

12. The method according to claim 9, wherein before the reducing, the method further comprises:
setting the first preset time based on user input.

13. The method according to claim 9, wherein after the reducing, the method further comprises:
further reducing the gain of the radio frequency power amplifier to reduce the uplink gain of the physical channel link when there is no uplink data to be transmitted through the physical channel link within a second preset time.

14. The method according to claim 13, wherein before the further reducing, the method further comprises:
setting the second preset time based on user input.

* * * * *